United States Patent
Lee et al.

(10) Patent No.: US 7,802,130 B2
(45) Date of Patent: Sep. 21, 2010

(54) MEMORY DEVICE, MEMORY SYSTEM INCLUDING THE SAME, AND METHOD THEREOF

(75) Inventors: Seung-Jae Lee, Hwaseong-si (KR); Young-Ho Lim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 397 days.

(21) Appl. No.: 12/071,096

(22) Filed: Feb. 15, 2008

(65) Prior Publication Data

US 2008/0209266 A1   Aug. 28, 2008

(30) Foreign Application Priority Data

Feb. 27, 2007   (KR) .................. 10-2007-0019784

(51) Int. Cl.
*G06F 11/00* (2006.01)
(52) U.S. Cl. .................... 714/5; 365/185.29
(58) Field of Classification Search ............ 714/5, 714/42; 365/185.29
See application file for complete search history.

(56) References Cited

U.S. PATENT DOCUMENTS

| | | | |
|---|---|---|---|
| 5,216,633 A * | 6/1993 | Weon et al. ............ 365/189.07 |
| 5,936,890 A | 8/1999 | Yeom | |
| 6,717,857 B2 | 4/2004 | Byeon et al. | |
| 7,594,157 B2 * | 9/2009 | Choi et al. .................. 714/764 |
| 2003/0117856 A1 * | 6/2003 | Lee et al. ............... 365/189.05 |
| 2006/0053353 A1 * | 3/2006 | Youn et al. .................. 714/718 |
| 2006/0198202 A1 * | 9/2006 | Erez ...................... 365/185.29 |
| 2007/0014163 A1 * | 1/2007 | Kim ...................... 365/189.12 |
| 2007/0028155 A1 * | 2/2007 | Kim et al. .................... 714/755 |
| 2007/0041247 A1 * | 2/2007 | Kang et al. ............. 365/185.12 |
| 2007/0067705 A1 * | 3/2007 | Kim .......................... 714/801 |
| 2007/0195635 A1 * | 8/2007 | Chen et al. ............ 365/230.08 |
| 2008/0209110 A1 * | 8/2008 | Pyeon et al. ................ 711/103 |
| 2009/0094482 A1 * | 4/2009 | Zilberman ................... 714/15 |

FOREIGN PATENT DOCUMENTS

| | | |
|---|---|---|
| JP | 11-110986 | 4/1999 |
| JP | 2003-141882 | 5/2003 |
| JP | 2005-332441 | 12/2005 |
| KR | 100255957 | 2/2000 |
| KR | 1020030033679 | 5/2003 |

* cited by examiner

*Primary Examiner*—Bryce P Bonzo
(74) *Attorney, Agent, or Firm*—Harness, Dickey & Pierce, P.L.C.

(57) ABSTRACT

A memory device may include a memory cell array, a page buffer circuit, and/or a control logic. The page buffer circuit may include first and second registers and be configured to store data to be programmed in the memory cell array. The control logic may be configured to control the page buffer circuit to reload data stored in the first register into the second register in response to a reload command input if a program operation fails.

16 Claims, 4 Drawing Sheets

MEMORY DEVICE, MEMORY SYSTEM INCLUDING THE SAME, AND METHOD THEREOF

PRIORITY STATEMENT

This U.S. non-provisional patent application claims the benefit of priority under 35 U.S.C. §119 to Korean Patent Application No. 10-2007-0019784, filed on Feb. 27, 2007, the entire contents of which are hereby incorporated by reference.

BACKGROUND

1. Field

Example embodiments relate to a semiconductor memory device, and for example, to a flash memory device.

2. Description of Related Art

Various technologies have been proposed to improve program performance of a memory system with a flash memory device. One of the proposed technologies provides a cache function to a page buffer of a flash memory device. The proposed technology provides cache function by including two latches (e.g., a main latch and a cache latch) in one page buffer. According to a conventional cache program operation, data to be programmed is loaded from a memory controller into the cache latch, and the data loaded in the cache latch is dumped into the main latch. A program operation is performed according to the data dumped into the main cache. During the program operation, the next data to be programmed is loaded from the memory controller into the cache latch.

FIG. 1 illustrates a program operation of a conventional flash memory device. Referring to FIG. 1, in a conventional flash memory device with the cache function, general program operations may be performed instead of the cache program operation. If general program operations are performed instead of the cache program operation, as mentioned above, data to be programmed is loaded from the memory controller into the cache latch, and the data loaded in the cache latch is dumped into the main latch. If the program operation fails, as illustrated in FIG. 1, data to be programmed is reloaded from the memory controller into the cache latch, and the reloaded data in the cache latch is dumped into the main latch. A reprogram operation is performed according to the reloaded data dumped into the main latch.

SUMMARY

Example embodiments provide a memory system and a method of thereof improving program performance.

According to an example embodiment, a memory device may include a memory cell array, a page buffer circuit, and/or a control logic. The page buffer circuit may include first and second registers and be configured to store data to be programmed in the memory cell array. The control logic may be configured to control the page buffer circuit to reload data stored in the first register into the second register in response to a reload command input if a program operation fails.

According to an example embodiment, the control logic may be configured to control the page buffer circuit to load the data to be programmed into the first register and to dump the data stored in the first register into the second register.

According to an example embodiment, the memory device may include a data output path configured to output the data stored in the first register to at least one external device.

According to an example embodiment, the memory device may include a data output path configured to output the data stored in the second register to at least one external device.

According to an example embodiment, the memory device may include a data output path configured to output one of the data stored in the first register and the second register to the outside according to control of the control logic.

According to an example embodiment, a memory system may include the memory device according to an example embodiment and/or a memory controller configured to control the memory device.

According to an example embodiment, the control logic may be configured to control the page buffer circuit to load the data to be programmed into the first register and to dump the data stored in the first register into the second register to perform the program operation.

According to an example embodiment, the memory device may include a data output path configured to output the data stored in the first register to at least one external device.

According to an example embodiment, the memory device may include a data output path configured to output the data stored in the second register to at least one external device.

According to an example embodiment the memory device further may include a data output path to output one of data in the first register and the second register to at least one external device according to control of the control logic.

According to an example embodiment, if the program operation fails, the memory device may be configured to reprogram the data to be programmed in the memory cell array without reloading data into the first register.

According to an example embodiment, a program method of a memory system may include transmitting data to be programmed into a memory device, performing a program operation on the transmitted data, and/or transmitting a reload command to the memory device without retransmitting the data to be programmed to reprogram the transmitted data if the program operation fails.

According to an example embodiment, the memory device may be included in a memory system and/or may be a flash memory device including a page buffer circuit with first and second registers, and/or the memory system may further include a memory controller configured to control the flash memory device.

According to an example embodiment, the method may include reloading the data stored in the first register into the second register in response to the reload command.

According to an example embodiment, the performing the program operation may include loading the data to be programmed into the first register and dumping the data loaded into the first register into the second register.

According to an example embodiment, the memory device may be a flash memory device.

BRIEF DESCRIPTION OF THE FIGURES

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
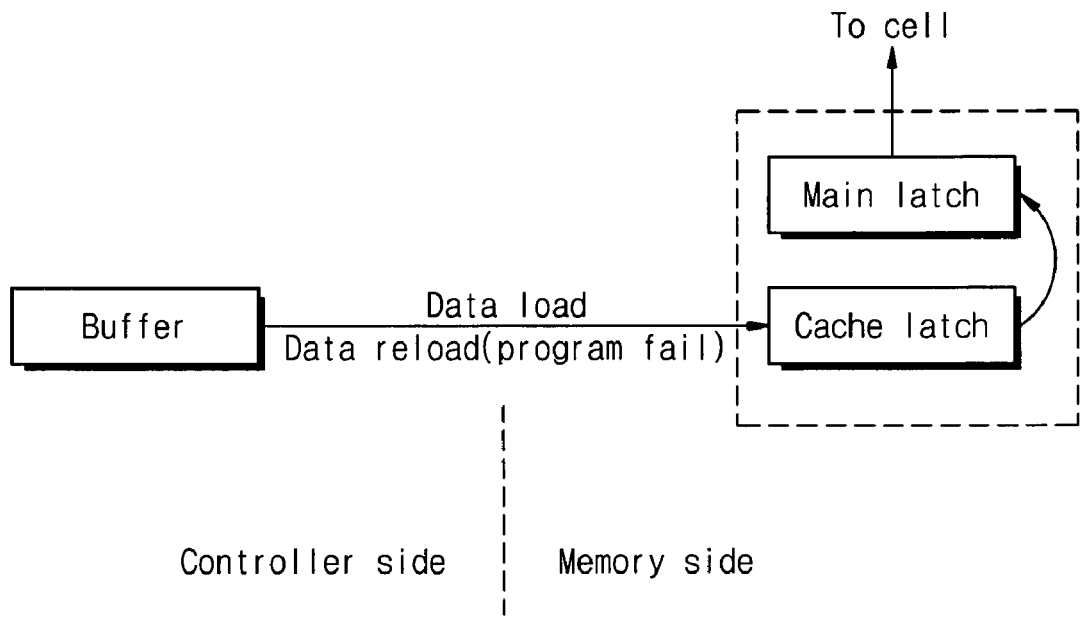
FIG. 1 is a view illustrating a program operation of a conventional flash memory device.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

A NAND flash memory device is used as an example for illustrating characteristics and functions of example embodiments described below. However, example embodiments are not limited thereto, and those skilled in the art will easily understand other advantages and performances of example embodiments Throughout the specification, the terms "write" and "program" have the same meaning and may be used interchangeably. An example memory device with the cache program function is disclosed in U.S. Pat. No. 6,717,857, titled "NON-VOLATILE SEMICONDUCTOR MEMORY DEVICE WITH CACHE FUNCTION AND PROGRAM, READ, AND PAGE COPY-BACK OPERATIONS THEREOF", which is hereby incorporated by reference.

Figure 2:
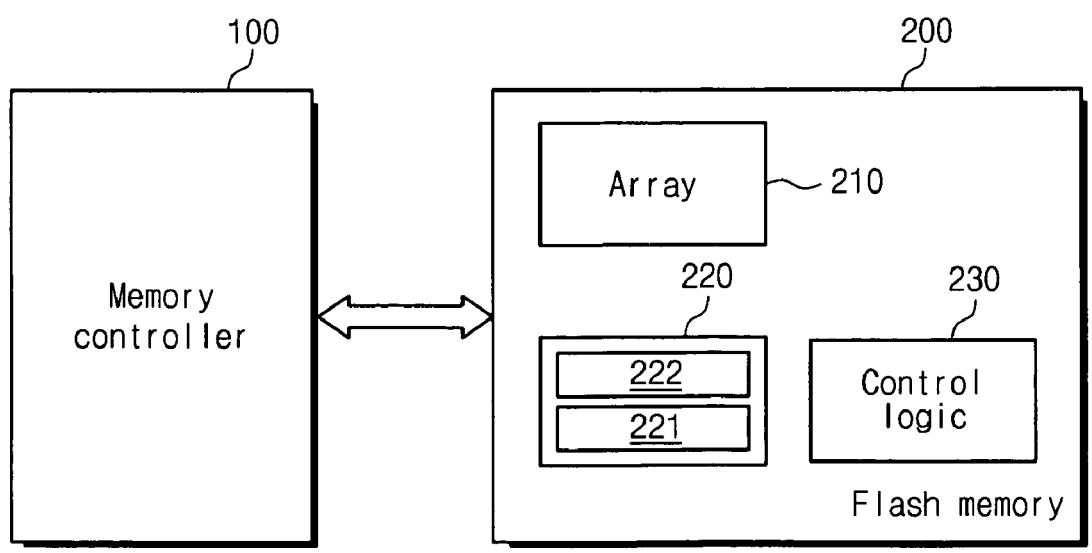
FIG. 2 is a block diagram of a memory system according to an example embodiment.

FIG. 2 is a block diagram of a memory system according to an example embodiment.

Referring to FIG. 2, a memory system may include a memory controller 100 and/or a flash memory device 200. The memory controller 100 may control the flash memory device 200 according to a request from the outside (e.g., a host). For example, the memory controller 100 may generate a reload command without retransmission of data to be programmed if a program operation of the flash memory device 200 is determined to have failed. The flash memory device 200 may include a memory cell array 210, a page buffer circuit 220, and/or a control logic 230. Although not illustrated in the drawings, it is apparent to one skilled in the art that the flash memory device 200 may further include a row selector, a column selector, a high voltage generator, and other well known elements of flash memory devices.

The control logic 230 may operate in response to a program command from the memory controller 100 and/or control the page buffer circuit 220 to store data to be programmed. The page buffer circuit 220 may be controlled by the control logic 230 and/or include a first register 221 and/or a second register 222. Each of the first and second registers 221 and 222 may include a plurality of latches. Latches in the first register 221 are called cache latches, and latches in the second register 222 are called main latches. The main latches may respectively correspond to the cache latches. The data to be stored in the memory cell array 210 may be loaded into the first register 221 according to control of the control logic 230. The data loaded in the first register 221 may be dumped into the second register 222 according to the control of the control logic 230. If a reload command is provided from the memory controller 100, the control logic 230 may control the page buffer circuit 220 to reload the data in the first register 221 to the second register 222. If a cache data output command is inputted from the memory controller 100, the control logic 230 may control the page buffer circuit 220 to output the data in the first register 221 to the memory controller 100.

Figure 3:
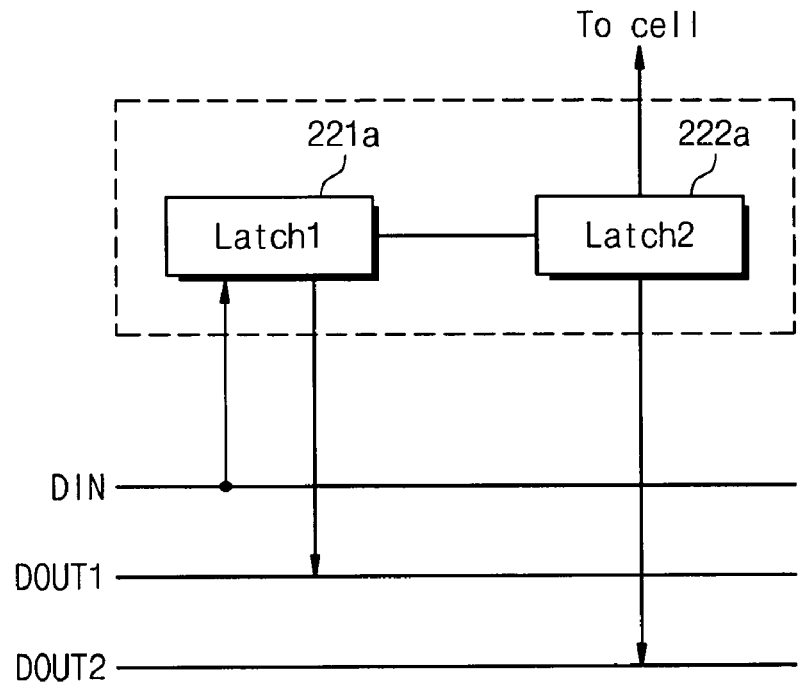
FIGS. 3 and 4 are views of data input/output paths according to example embodiments.
Figure 4:
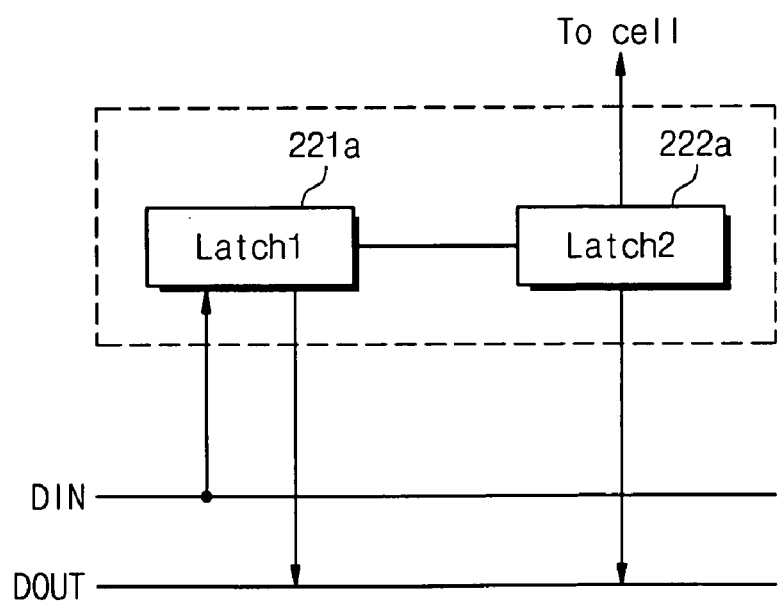

FIGS. 3 and 4 are views of data input/output paths according to example embodiments.

For convenience of description, only one page buffer of the page buffer circuit 220 is illustrated in FIG. 3. The page buffer may include a cache latch 221a and/or a main latch 222a. Data provided from the outside may be transmitted into the cache latch 221a through a data input line DIN according to control of the control logic 230. The data stored in the main latch 222a may be outputted into the memory controller 100 through a data output line DOUT2 according to the control of the control logic 230. The data stored in the cache latch 221a may be outputted to the memory controller 100 through a data output line DOUT1 according to the control of the control logic 230. For example, if a cache data output command is inputted from the memory controller 100, the data stored in the cache latch 221a may be outputted to the memory controller 100 through the data output line DOUT1 according to the control of the control logic 230. The data stored in the cache latches may be partially modified according to a request of the memory controller 100. For example, the first register 221 of the flash memory device 200 may be used as a buffer of the memory controller 100. The data output lines DOUT1 and DOUT2 may be selected by the control logic 230 and data may be transmitted through the selected output line. Alternatively, as illustrated in FIG. 4, one of data in the cache latch 221a and the main latch 222a may be outputted through one data output line DOUT. In this case, an output of the cache latch 221a or the main latch 222a will be determined according to the control of the control logic 230.

Figure 5:
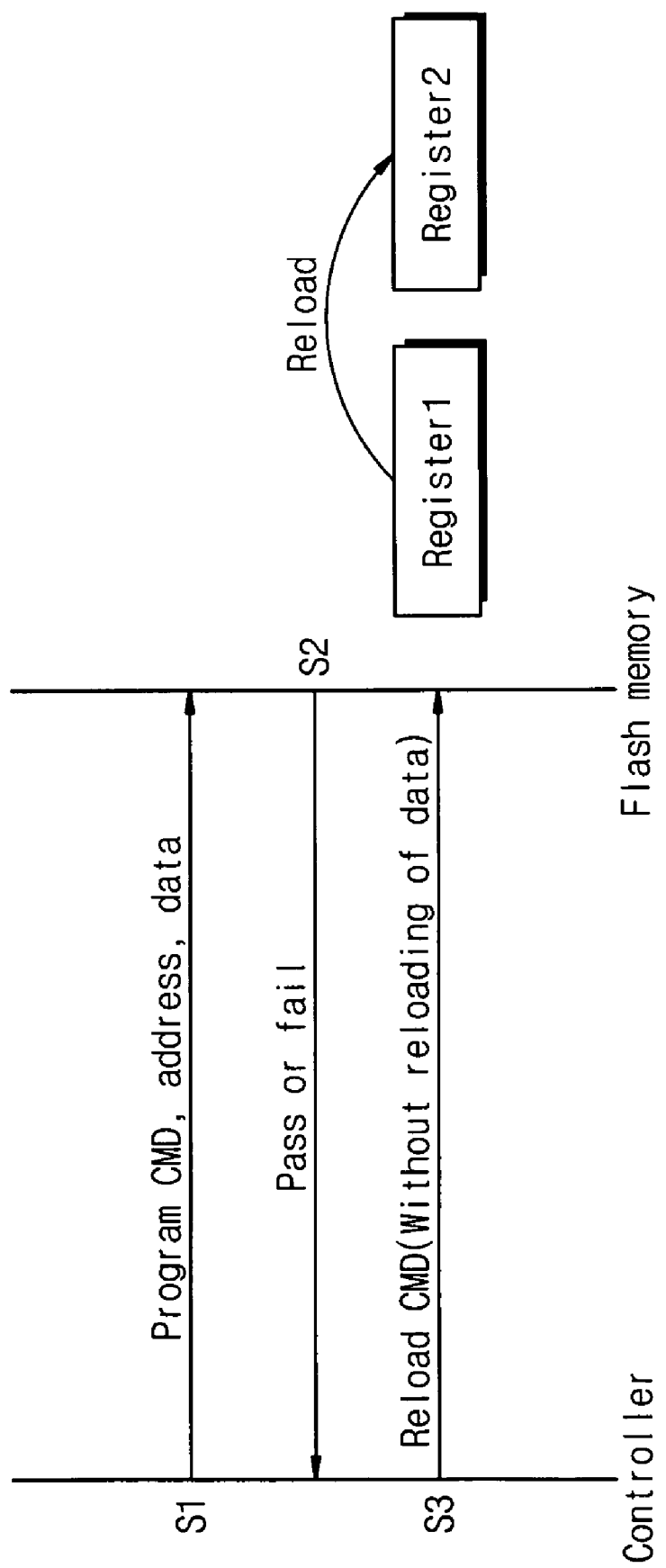
FIG. 5 is a view illustrating a program method of a memory system according to an example embodiment.

FIG. 5 is a view illustrating a program method of a memory system according to an example embodiment. Hereinafter, a program method of the memory system will be described with reference to the drawings.

If a program operation begins, the memory controller 100 may transmit data to be programmed, a program command, and/or an address to the flash memory device 200 at a desired, or alternatively, a predetermined timing (S1). The control logic 230 of the flash memory device 200 may control the page buffer circuit 220 to load the data transmitted from the memory controller 100 into the cache latches 221a of the first register 221. The control logic 230 may control the page buffer circuit 220 to dump the data loaded in the first register 221 into the second register 222. According to the inputted address, an arbitrary word line may be selected and memory cells in the selected word line are programmed according of the data stored in the second register 222.

If the program operation is completed according to the inputted data, the memory controller 100 may request a result to the flash memory device 200. The result is related to whether the program operation is passed or not. The request is typically called a status read operation. According to the status read operation, pass/fail information is outputted to the memory controller 100 (S2). If the pass/fail information represents program pass, the program operation is completed. Alternatively, the pass/fail information may represent program fail, the memory controller 100 may output a reload command to the flash memory device 200 without retransmission of the data to be programmed (S3).

The flash memory device 200 may control the page buffer circuit 220 in response to the reload command. For example, according to the input of the reload command, the data (e.g., previously inputted and loaded data) stored in the first register 222 may be reloaded into the second register 222 according to the control of the control logic 230. After the data is reloaded into the second register 222, a program operation is performed according to a well-known method.

As described above, if a program fail occurs, the data stored in the first register 221 (e.g., cache latches) may be used to perform the program operation without data retransmission. Accordingly, general program performance of the memory system may be improved. Because there is no need to maintain data to be retransmitted if a program operation fails, a buffer capacity of the memory controller 100 may be reduced.

Figure 6:
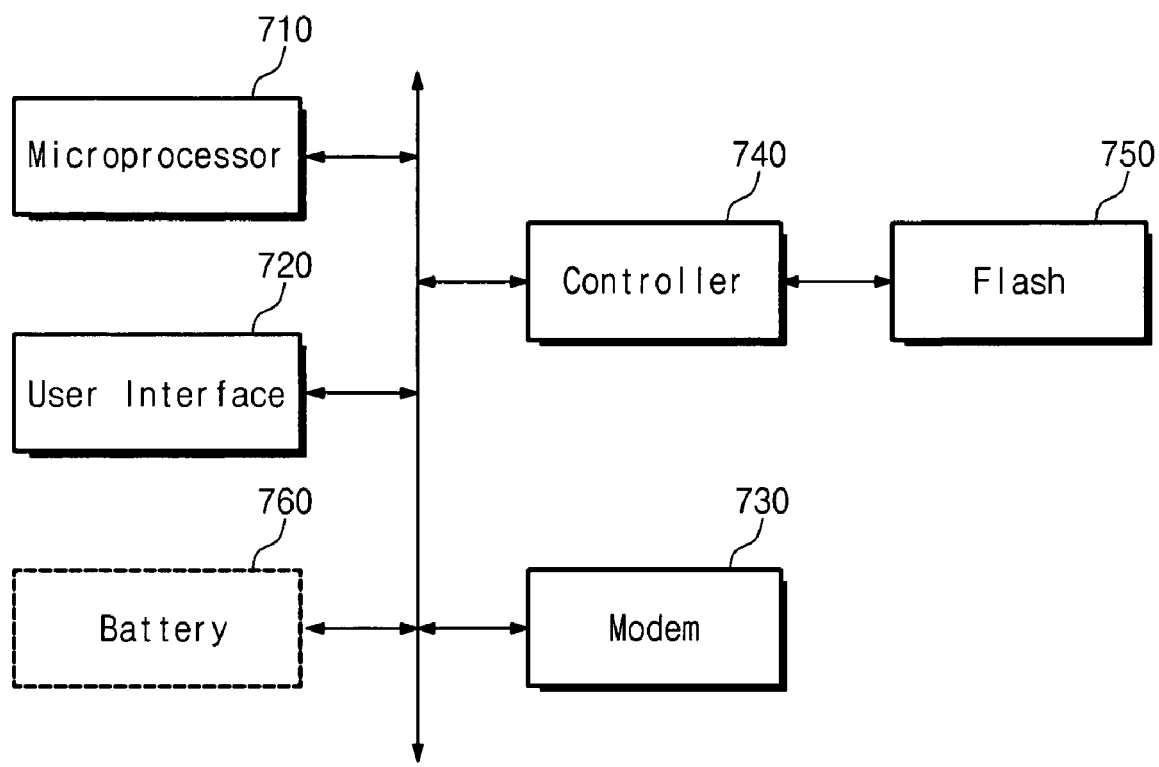
FIG. 6 is a block diagram of a computing system with a memory system according to an example embodiment.

A flash memory device may be a non-volatile memory device retaining stored data if no power is applied. As demands on mobile devices (e.g., cellular phones, PDAs, digital cameras, portable game consoles, and MP3s) increase, flash memory devices are extensively used for data storage and code storage. A flash memory device may be used for home applications such as HDTVs, DVDs, routers, and GPSs. FIG. 6 is a block diagram of a computing system with a memory system according to an example embodiment. The computing system may include a microprocessor 710 electrically connected to a bus, a user interface 720, a modem 730 (e.g., a baseband chipset), a memory controller 740, and/or a flash memory device 750. The memory controller 740 and the flash memory device 750 may have the same structure as that of an example embodiment illustrated in FIG. 2. The flash memory device 750 may store N-bit data (N is an integer equal to or higher than 1) that were processed or will be processed by the microprocessor 710 through the memory controller 740. If the computing system of example embodiments is a mobile device, a battery 750 may be provided to supply an operation voltage of the computing system. Although not illustrated in the drawings, one skilled in the art will recognize that the computing system may include an application chipset, a camera image processor (CIS), a mobile DRAM, and/or other well-known elements of computing systems.

As is well known to one skilled in the art, a reprogram operation due to a program fail is performed to program data in a page different from a previously selected page. Accordingly, after a reload command is inputted, an address and a program command for a new page are inputted into the flash memory device. Alternatively, a reload command and an address are provided to the flash memory device.

As described above, during program fail, a program operation may be performed by using the data stored in the first register 221 (e.g., cache latches) without data retransmission. Therefore, general program performance of the memory system may be improved. Because there is no need to maintain data to be retransmitted during program fail, a buffer capacity of the memory controller may be reduced.

Although example embodiments have been shown and described in this specification and figures, it would be appreciated by those skilled in the art that changes may be made to the illustrated and/or described example embodiments without departing from their principles and spirit.

What is claimed is:

1. A memory device comprising:
    a memory cell array;
    a page buffer circuit including first and second registers and configured to store data to be programmed in the memory cell array; and
    a control logic configured to control the page buffer circuit to reload data stored in the first register into the second register in response to a reload command input if a program operation fails.

2. The device of claim 1, wherein the control logic is configured to control the page buffer circuit to load the data to be programmed into the first register and to dump the data stored in the first register into the second register.

3. The device of claim 1, further comprising:
    a data output path configured to output the data stored in the first register to at least one external device.

4. The device of claim 1, further comprising:
    a data output path configured to output the data stored in the second register to at least one external device.

5. The device of claim 1, further comprising:
    a data output path configured to output one of the data stored in the first register and the second register to at least one external device according to control of the control logic.

6. A memory system comprising:
    the memory device of claim 1; and a memory controller configured to control the memory device.

7. The memory system of claim 6, wherein the control logic is configured to control the page buffer circuit to load the data to be programmed into the first register and to dump the data stored in the first register into the second register to perform the program operation.

8. The memory system of claim 6, wherein the memory device further comprises:
   a data output path configured to output the data stored in the first register to at least one external device.

9. The memory system of claim 6, wherein the memory device further comprises:
   a data output path configured to output the data stored in the second register to at least one external device.

10. The memory system of claim 6, wherein the memory device further comprises:
    a data output path to output one of the data stored in the first register and the second register to at least one external device according to control of the control logic.

11. The memory system of claim 6, wherein if the program operation fails, the memory device is configured to reprogram the data to be programmed in the memory cell array without reloading data into the first register.

12. The device of claim 1, wherein the memory device is a flash memory device.

13. A program method, the method comprising:
    transmitting data to be programmed into a memory device;
    performing a program operation on the transmitted data; and
    transmitting a reload command to the memory device without retransmitting the data to be programmed to reprogram the transmitted data if the program operation fails.

14. The program method of claim 13, wherein
    the memory device is included in a memory system and is a flash memory device including a page buffer circuit with first and second registers, and
    the memory system further includes a memory controller configured to control the flash memory device.

15. The method of claim 14, wherein the performing the program operation includes loading the data to be programmed into the first register and dumping the data loaded into the first register into the second register.

16. The method of claim 15, further comprising:
    reloading the data stored in the first register into the second register in response to the reload command.

* * * * *